(12) United States Patent
Hayashi (10) Patent No.: US 7,956,994 B2
(45) Date of Patent: Jun. 7, 2011

(54) MEASUREMENT APPARATUS FOR MEASURING TRANSMITTANCE DISTRIBUTION OF OPTICAL SYSTEM

(75) Inventor: Naoto Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 277 days.

(21) Appl. No.: 12/258,496

(22) Filed: Oct. 27, 2008

(65) Prior Publication Data

US 2009/0109439 A1    Apr. 30, 2009

(30) Foreign Application Priority Data

Oct. 31, 2007   (JP) ................................. 2007-283792

(51) Int. Cl.
    *G01J 1/00*    (2006.01)
    *G01B 9/02*    (2006.01)
(52) U.S. Cl. .................. 356/124; 356/433; 356/233
(58) Field of Classification Search .................. 356/433, 356/434, 229–233
See application file for complete search history.

(56) References Cited

U.S. PATENT DOCUMENTS

| | | | |
|---|---|---|---|
| 6,914,680 B2 * | 7/2005 | Kawate | 356/434 |
| 6,937,345 B2 * | 8/2005 | Kuramoto | 356/515 |
| 2006/0170932 A1 * | 8/2006 | Hayashi et al. | 356/495 |

FOREIGN PATENT DOCUMENTS

JP          2005-158828 A       6/2005

\* cited by examiner

*Primary Examiner* — Gregory J Toatley
*Assistant Examiner* — Rebecca C Slomski
(74) *Attorney, Agent, or Firm* — Canon U.S.A., Inc., I.P. Division (57) ABSTRACT

A measurement apparatus which measures a transmittance distribution of an optical system, comprises a light source, a first spherical mirror which forms reference light by reflecting light which is emitted by the light source and is not transmitted through the optical system, a second spherical mirror which forms test light by reflecting light which is emitted by the light source and is transmitted through the optical system, a measurement unit which measures intensity distributions of the reference light and the test light, a unit which calculates reflectance distributions of the first spherical mirror and the second spherical mirror, and an arithmetic unit which calculates a transmittance distribution on a pupil plane of the optical system, on the basis of the intensity distributions of the reference light and the test light, and the reflectance distributions of the first spherical mirror and the second spherical mirror.

4 Claims, 7 Drawing Sheets

PRIOR ART

MEASUREMENT APPARATUS FOR MEASURING TRANSMITTANCE DISTRIBUTION OF OPTICAL SYSTEM

BACKGROUND OF THE INVENTION

1. Field of the Invention

The present invention relates to a measurement apparatus which measures the transmittance distribution of an optical system to be measured, an exposure apparatus which incorporates the measurement apparatus, and a device manufacturing method of manufacturing a device using the exposure apparatus.

2. Description of the Related Art

Figure 11:
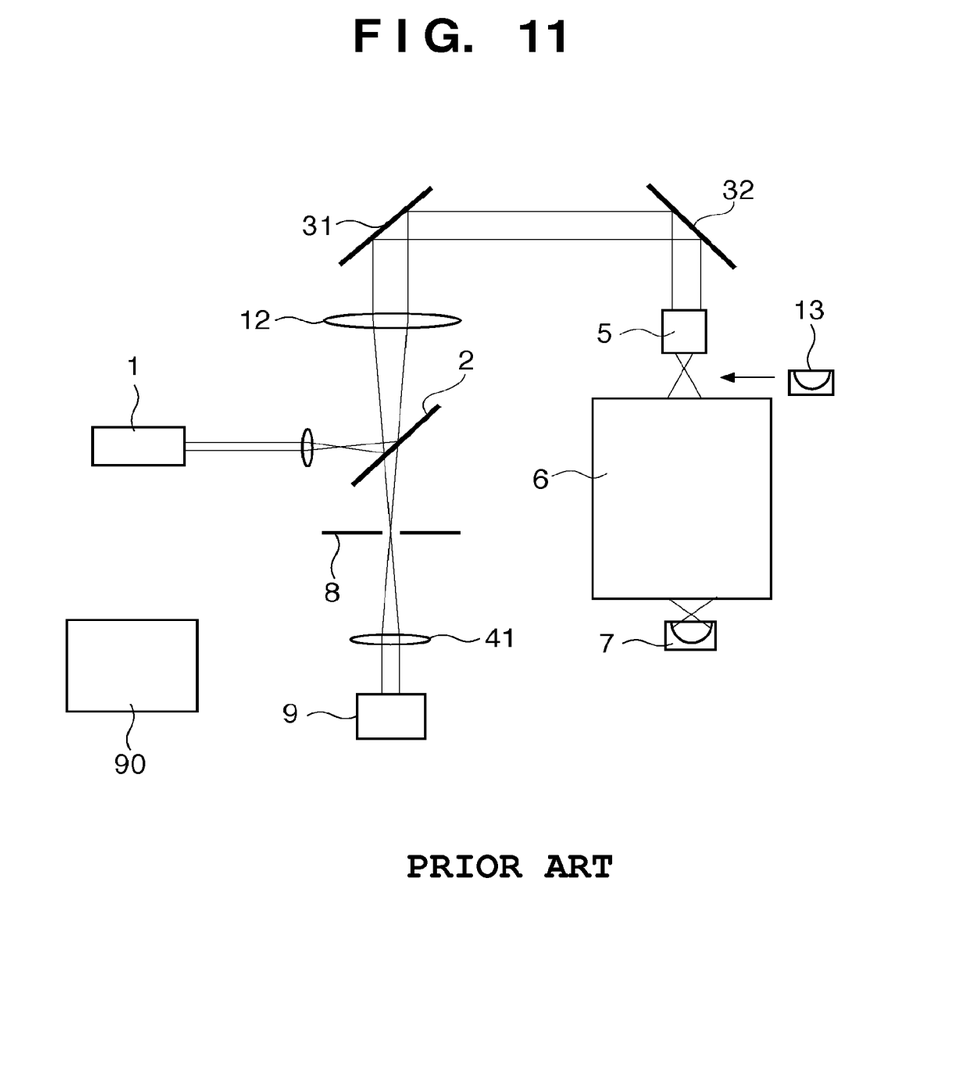
FIG. 11 shows the arrangement of a measurement apparatus for measuring the transmittance distribution of an optical system to be measured.

FIG. 11 shows the arrangement of a measurement apparatus for measuring the transmittance distribution of an optical system to be measured. A method of measuring the intensity distribution of reference light will be explained first. An RS mirror (first spherical mirror) 13 for forming reference light is inserted between a condenser lens 5 and an optical system to be measured 6. A light beam emitted by a light source 1 is reflected by a half mirror 2, and reaches the condenser lens 5 via a beam expander 12 and mirrors 31 and 32. A light beam component which emerges from the condenser lens 5 and is reflected by the RS mirror 13 is transmitted through the half mirror 2, and forms a reference light intensity distribution Irsa(x, y) on the image sensing plane of an image sensor 9 via an imaging optical system 41.

A method of measuring the intensity distribution of test light will be explained next. A light beam transmitted through the optical system to be measured 6 is reflected by an RS mirror (second spherical mirror) 7 for forming test light. The light beam reflected by the RS mirror 7 is transmitted through the half mirror 2, and forms a test light intensity distribution Irsb(x, y) on the image sensing plane of the image sensor 9 via the imaging optical system 41.

On the basis of the reference light intensity distribution Irsa(x, y) and test light intensity distribution Irsb(x, y), the transmittance distribution of the optical system to be measured 6 is calculated. Letting I0 be the incident light intensity, Tsys(x, y) be the transmittance distribution of only the measurement apparatus, and Rrsa be the reflectance of the RS mirror 13, the reference light intensity distribution Irsa(x, y) is given by:

$$Irsa(x, y) = Tsys(x, y) \times Rrsa \times I0$$

Likewise, letting Tlens(x, y) be the transmittance distribution of the optical system to be measured 6, and Rrsb be the reflectance of the RS mirror 7, the intensity distribution Irsb(x, y) of the test light as the light reflected by the RS mirror 7 is given by:

$$Irsb(x, y) = Tsys(x, y) \times (Tlens(x, y))^2 \times Rrsb \times I0$$

Hence, the transmittance distribution of the optical system to be measured 6 is given by:

$$Tlens(x, y) = (Rrsa/Rrsb)^{1/2} \times (Irsa(x, y)/Irsb(x, y))^{1/2}$$
$$= Const \times (Irsb(x, y)/Irsa(x, y))^{1/2}$$

Note that Rrsa and Rrsb are measured by, e.g., a reflectance measurement device in advance.

Another method of measuring the transmittance of the optical system to be measured is also known (Japanese Patent Laid-Open No. 2005-158828).

The transmittance distribution of the optical system to be measured has conventionally been calculated assuming that the reflectances of both the RS mirrors 13 and 7 are uniform. However, if the reflectances of these two RS mirrors are nonuniform (i.e., their reflectances exhibit nonuniform distributions), the measurement result of the transmittance distribution often suffers from errors.

SUMMARY OF THE INVENTION

The present invention has been made in consideration of the above-described problem, and has as its exemplary object to measure, e.g., the transmittance distribution of an optical system to be measured with high accuracy.

According to the first aspect of the present invention, there is provided a measurement apparatus which measures a transmittance distribution of an optical system to be measured, comprising a light source, a first spherical mirror which forms reference light by reflecting light which is emitted by the light source and is not transmitted through the optical system to be measured, a second spherical mirror which forms test light by reflecting light which is emitted by the light source and is transmitted through the optical system to be measured, a measurement unit which measures intensity distributions of the reference light and the test light, a unit which calculates reflectance distributions of the first spherical mirror and the second spherical mirror, and an arithmetic unit which calculates a transmittance distribution on a pupil plane of the optical system to be measured, on the basis of the intensity distributions of the reference light and the test light, and the reflectance distributions of the first spherical mirror and the second spherical mirror.

According to the second aspect of the present invention, there is provided to an exposure apparatus comprising a projection optical system to project a pattern of an original onto a substrate, an illumination optical system to guide light to the projection optical system, and the measurement apparatus defined as the first aspect of the invention, wherein the optical system to be measured comprises the projection optical system.

According to the third aspect of the present invention, there is provided a device manufacturing method comprising the steps of exposing a substrate using the exposure apparatus defined as the second aspect of the present invention, and developing the substrate.

According to the fourth aspect of the present invention, there is provided a method of measuring a transmittance distribution of an optical system to be measured, comprising the steps of measuring an intensity distribution of reference light which is emitted by a light source and is reflected by a first spherical mirror without being transmitted through the optical system to be measured, measuring an intensity distribution of test light which is emitted by the light source and is reflected by a second spherical mirror upon being transmitted through the optical system to be measured, calculating reflectance distributions of the first spherical mirror and the second spherical mirror, and calculating a transmittance distribution on a pupil plane of the optical system to be measured, on the basis of the intensity distributions of the reference light and the test light, and the reflectance distributions of the first spherical mirror and the second spherical mirror.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

First Embodiment

Figure 1:
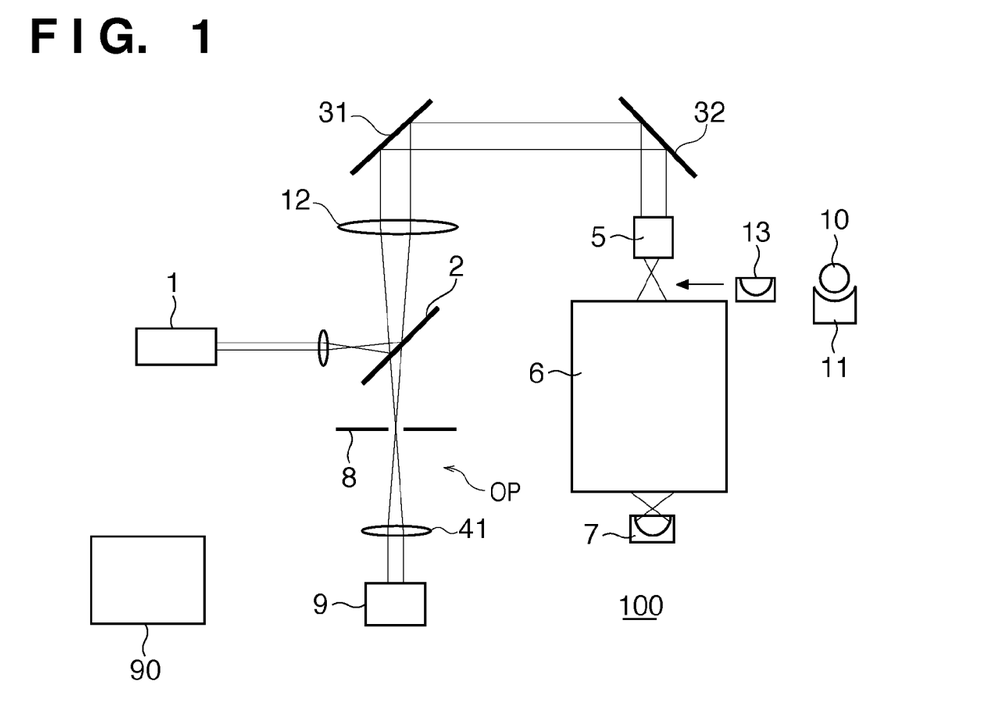
FIG. 1 shows a schematic arrangement of a measurement apparatus according to the first embodiment of the present invention.
Figure 2:
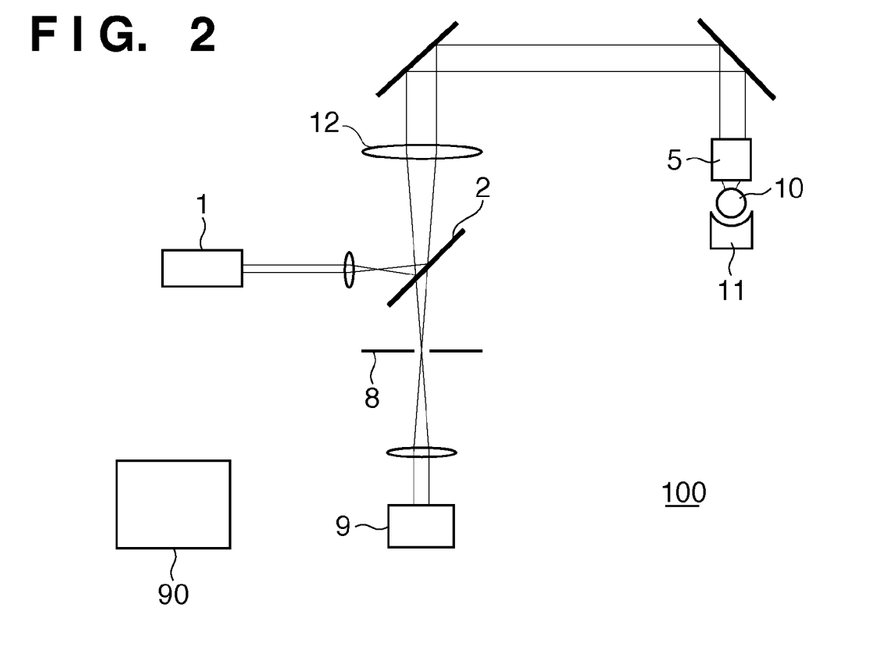
FIG. 2 shows another schematic arrangement of the measurement apparatus according to the first embodiment of the present invention.
Figure 3:
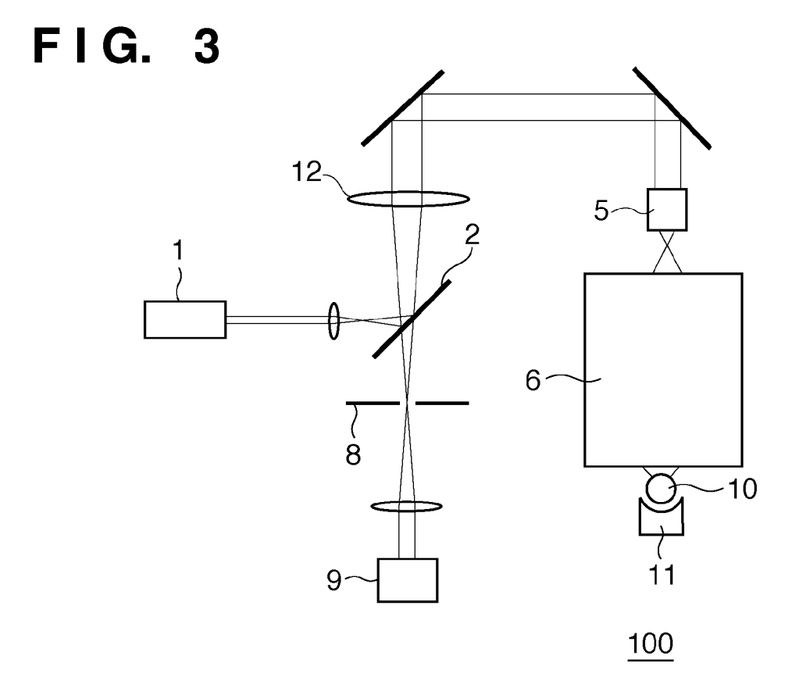
FIG. 3 shows still another schematic arrangement of the measurement apparatus according to the first embodiment of the present invention.

FIGS. 1 to 3 show the schematic arrangements of a measurement apparatus according to the first embodiment of the present invention. The same reference numerals as in the measurement apparatus shown in FIG. 11 denote the same constituent elements in FIGS. 1 to 3. A measurement apparatus 100 measures the transmittance distribution of an optical system to be measured 6 (the transmittance distribution on its pupil plane). An example of the optical system to be measured 6 is a projection optical system of an exposure apparatus. The exposure apparatus projects a pattern formed on an original (reticle or mask) onto a substrate (wafer) by the projection optical system, thereby exposing a photosensitive agent applied on the substrate. The measurement apparatus 100 comprises a measurement unit for measuring the reflectance distributions of RS mirrors 13 and 7. The measurement unit includes a ball-shaped mirror 10 and driving mechanism 11. The ball-shaped mirror 10 can rotate about an axis which passes through the center of the ball.

A method of measuring a transmittance distribution Tlens (x, y) of the optical system to be measured 6 by the measurement apparatus 100 will be explained below. The optical system to be measured includes at least one optical element (e.g., a lens).

A method of calculating a reflectance distribution Rrsa(x, y) of the RS mirror 13, and a transmitted light distribution Isys(x, y) of a measurement optical system OP including optical elements 5 to 41 inserted in the light path from a condenser lens 5 to an image sensor 9 in the measurement apparatus 100 will be explained first. Note that x and y are coordinate values indicating a position in a two-dimensional space.

A driving unit (not shown), for example, inserts the RS mirror (first spherical mirror) 13 between the condenser lens (condensing optical system) 5 and the optical system to be measured 6. A light beam emitted by a light source 1 is reflected by a half mirror 2, and reaches the condenser lens 5 via a beam expander 12 and mirrors 31 and 32. The light beam which emerges from the condenser lens 5 is reflected by the RS mirror 13, transmitted through the half mirror 2, and forms a reference light intensity distribution Irsa(x, y) on the image sensing plane of the image sensor 9 via an imaging optical system 41. The reference light intensity distribution Irsa(x, y) is detected as the values of a plurality of two-dimensionally arrayed pixels which constitute an image sensed by the image sensor 9. In other words, the reference light intensity distribution Irsa(x, y) is sensed by the image sensor 9.

Next, as shown in FIG. 2, the driving unit (not shown) sets the ball-shaped mirror 10 in place of the RS mirror 13. The ball-shaped mirror 10 rotates about the center of the ball as the rotation center upon being driven by the driving mechanism 11.

The ball-shaped mirror 10 is set such that its center matches the converging point of the condenser lens 5. A light beam emitted by the light source 1 is reflected by the half mirror 2, strikes the ball-shaped mirror 10 via the beam expander 12, mirrors 31 and 32, and condenser lens 5, and is reflected by the ball-shaped mirror 10. The light beam reflected by the ball-shaped mirror 10 returns via, e.g., the condenser lens 5, is transmitted through the half mirror 2, and forms a reflected light intensity distribution Iballa(x, y) for the ball-shaped mirror 10 on the image sensing plane of the image sensor 9 via the imaging optical system 41. The reflected light intensity distribution Iballa(x, y) is detected as the values of a plurality of two-dimensionally arrayed pixels which constitute an image sensed by the image sensor 9. In other words, the reflected light intensity distribution Iballa(x, y) is sensed by the image sensor 9.

In sensing the reflected light intensity distribution Iballa(x, y) by the image sensor 9, the reflected light intensity distribution Iballa(x, y) can be averaged by rotating the ball-shaped mirror 10 using the driving mechanism 11. This averaging means removing any nonuniformity (nonuniform distribution) of the reflectance of the ball-shaped mirror 10.

Assume that the ball-shaped mirror 10 is rotated about the optical axis of the measurement optical system OP by the driving mechanism 11. In this case, strictly speaking, the reflectance of the ball-shaped mirror 10 is averaged in the circumferential direction of the ball-shaped mirror 10 about the optical axis. However, when the dependence of the reflectance on the radial direction is sufficiently small, any nonuniformity of the reflectance of the ball-shaped mirror 10 in both the circumferential direction and radial direction is removed even by averaging the reflectance in only the circumferential direction.

The driving mechanism 11 may rotate the ball-shaped mirror 10 about a plurality of axes which pass through the center of the ball of the ball-shaped mirror 10. This makes it possible to enhance the effect of removing any nonuniformity of the reflectance.

The ball-shaped mirror 10 may be rotationally driven by the driving mechanism 11 either during the sensing of the reflected light intensity distribution Iballa(x, y) by the image sensor 9 (during electric charge accumulation) or during the interval between successive image sensing operations. Alternatively, a plurality of images (reflected light intensity distributions Iballa(x, y)) may be sensed by the image sensor 9 while rotationally driving the ball-shaped mirror 10 by the driving mechanism 11.

Averaging the reflected light intensity distribution Iballa(x, y) makes it possible to acquire a transmitted light distribution Isys(x, y) of the measurement optical system OP, in which any nonuniformity of the reflectance of the ball-shaped mirror 10 is removed or reduced. For example, when a plurality of images (reflected light intensity distributions Iballa(x, y)) are sensed while rotating the ball-shaped mirror 10 by the driving mechanism 11, averaging the plurality of images by the number of sensed images makes it possible to acquire an average transmitted light intensity distribution Isys(x, y) of the measurement optical system OP.

An arithmetic unit 90 provided to the measurement apparatus 100 calculates the reflectance distribution Rrsa(x, y) of the RS mirror 13 in accordance with:

$$Rrsa(x, y)=C1 \times Irsa(x, y)/Isys(x, y)$$

where C1 is a constant.

The obtained reflectance distribution Rrsa(x, y) of the RS mirror 13 is registered in a memory (not shown) of the measurement apparatus 100. The memory can be built in, e.g., the arithmetic unit 90. The average transmitted light intensity distribution Isys(x, y) of the measurement optical system OP may be corrected on the basis of the reflectance distribution Rrsa(x, y) registered, and a reference light intensity distribution Irsa(x, y) which is newly detected thereafter.

A method of calculating a reflectance distribution Rrsb(x, y) of the RS mirror 7 will be explained next. First, the optical system to be measured 6 and RS mirror (second spherical mirror) 7 are set such that a light beam which emerges from the condenser lens 5 reaches the RS mirror 7 upon propagating through the optical system to be measured 6. In this state, a light beam emitted by the light source 1 is reflected by the half mirror 2, enters the optical system to be measured 6 via the beam expander 12, mirrors 31 and 32, and condenser lens 5, is transmitted through the optical system to be measured 6, and reaches the RS mirror 7. The light beam which has reached the RS mirror 7 is reflected by it, returns via, e.g., the optical system to be measured 6 and condenser lens 5, is transmitted through the half mirror 2, and forms a test light intensity distribution Irsb(x, y) on the image sensing plane of the image sensor 9. The test light intensity distribution Irsb(x, y) is detected as the values of a plurality of two-dimensionally arrayed pixels which constitute an image sensed by the image sensor 9. In other words, the test light intensity distribution Irsb(x, y) is sensed by the image sensor 9.

Next, as shown in FIG. 3, the driving unit (not shown) sets the ball-shaped mirror 10 in place of the RS mirror 7. The ball-shaped mirror used in place of the RS mirror 7 may be the same as or different from that used in place of the RS mirror 13. The ball-shaped mirror 10 rotates upon being driven by the driving mechanism 11. The ball-shaped mirror 10 is set such that its center matches the converging point of the optical system to be measured 6.

A light beam emitted by the light source 1 is reflected by the half mirror 2, enters the optical system to be measured 6 via the beam expander 12, mirrors 31 and 32, and condenser lens 5, is transmitted through the optical system to be measured 6, reaches the ball-shaped mirror 10, and is reflected by the ball-shaped mirror 10. The light beam reflected by the ball-shaped mirror 10 returns via, e.g., the optical system to be measured 6 and condenser lens 5, is transmitted through the half mirror 2, and forms a reflected light intensity distribution Iballb(x, y) for the ball-shaped mirror 10 on the image sensing plane of the image sensor 9. Even at this time, the reflected light intensity distribution Iballb(x, y) can be averaged by rotating the ball-shaped mirror 10 by the driving mechanism 11. This averaging means removing any nonuniformity of the reflectance of the ball-shaped mirror 10. This averaging makes it possible to acquire an average reflected light intensity distribution Ilens(x, y) in which any nonuniformity of the reflectance of the ball-shaped mirror 10 is removed or reduced. The average reflected light intensity distribution Ilens(x, y) is a transmitted light distribution obtained by a round trip between the measurement optical system OP and optical system to be measured 6 in the measurement apparatus 100.

The arithmetic unit 90 calculates the reflectance distribution Rrsb(x, y) of the RS mirror 7 in accordance with:

$$Rrsb(x, y)=C2 \times Irsb(x, y)/Ilens(x, y)$$

where C2 is a constant.

The obtained reflectance distribution Rrsb(x, y) of the RS mirror 7 is registered in the memory (not shown) of the measurement apparatus 100.

On the basis of the reflectance distributions Rrsa(x, y) and Rrsb(x, y) of the RS mirrors 13 and 7, respectively, the arithmetic unit 90 calculates the transmittance distribution Tlens (x, y) of the optical system to be measured 6 in accordance with:

$$Tlens(x, y)=C3 \times (Rrsa(x, y)/Rrsb(x, y))^{1/2} \times (Irsb(x, y)/Irsa(x, y))^{1/2}$$

As described above, the transmittance distribution of the optical system to be measured 6 can be measured with high accuracy by taking account of the reflectance distributions Rrsa(x, y) and Rrsb(x, y) of the RS mirrors 13 and 7, respectively.

Second Embodiment

Figure 4:
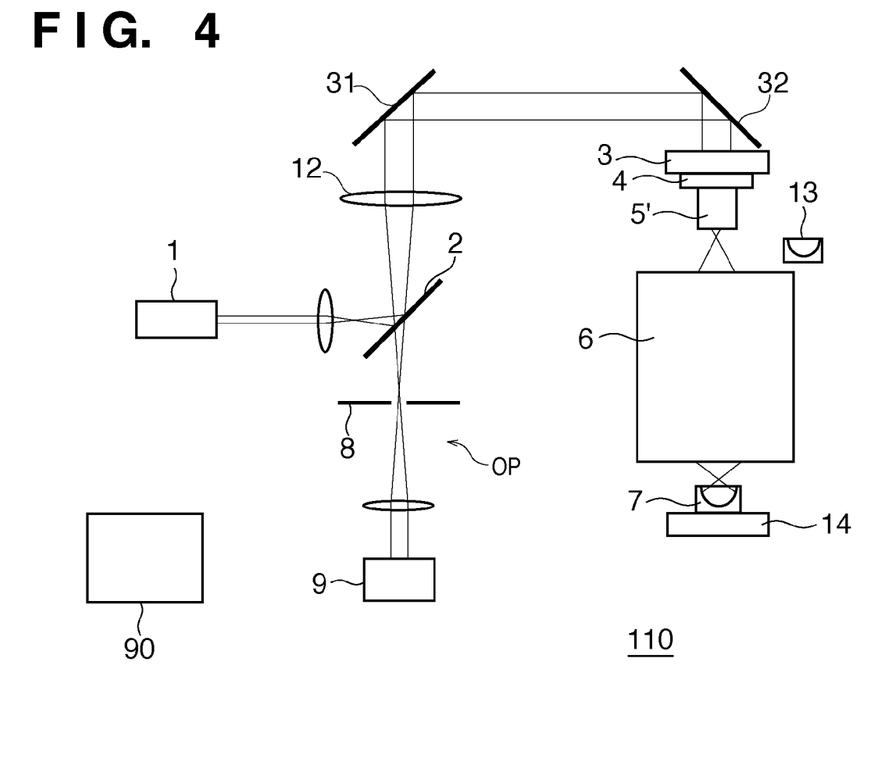
FIG. 4 shows the schematic arrangement of a measurement apparatus according to the second and third embodiments of the present invention.

FIG. 4 shows the schematic arrangement of a measurement apparatus 110 according to the second embodiment of the present invention. This embodiment provides a measurement apparatus in which a Fizeau interferometer which has, as the TS lens, a condenser lens 5' corresponding to the condenser lens 5 according to the first embodiment is equipped with a function of measuring the transmittance distribution of the optical system to be measured. The final surface of the TS lens has a radius of curvature which is equal to the distance between the final surface and the focal point. Note that the final surface and focal point mean those of the TS lens.

An important factor associated with the performance of the optical system to be measured is the transmitted wave front. Interference measurement can be used to evaluate the transmitted wave front. Equipping an interferometer with a function of measuring the transmittance distribution as in this embodiment obviates the need to prepare separate devices, which is advantageous to cost saving.

A light beam emitted by a light source 1 is reflected by a half mirror 2, and reaches the condenser lens (TS lens) 5' via a beam expander 12 and mirrors 31 and 32. A certain component of the light beam is transmitted through the condenser lens (TS lens) 5', and reflected by an RS mirror 13. The condenser lens (TS lens) 5' is driven by a PZT actuator 4 mounted on an X-Y-Z stage (alignment mechanism) 3.

Except for the final surface, the condenser lens (TS lens) 5' is coated with an anti-reflection coating against the wavelength of a light beam emitted by the light source 1, and a certain component of the light beam is reflected only by the final surface. A light beam component reflected by the condenser lens (TS lens) 5' will be referred to as a reference light beam, and a light beam component transmitted through it will be referred to as a test light beam hereinafter. The transmitted wave front of an optical system to be measured 6 is measured using interference between the reference light beam and the test light beam.

Interference fringes such as those formed in measuring the wave front are unnecessary in measuring the transmittance distribution of the optical system to be measured 6. Methods of measuring the reflectance distributions of the RS mirror 13 and an RS mirror 7 are the same as those in the first embodiment, and a method of removing interference fringes will be explained herein.

First, the condenser lens (TS lens) 5' is set such that its focal point matches the center of curvature of the RS mirror 13. In this state, a spatial filter 8 is shifted in a direction perpendicular to the optical axis by Δspf, and the condenser lens (TS lens) 5' is also shifted in a direction perpendicular to the optical axis by Δ by driving the X-Y-Z stage 3. In this state, only the test light beam passes through the spatial filter 8. Letting Fts be the focal length of the condenser lens (TS lens) 5', and Fexp be the focal length of the beam expander 12, the amount of shift Δspf of the spatial filter 8 and that Δ of the condenser lens (TS lens) 5' satisfy:

$$\Delta spf = 2 \times \Delta \times Fexp/Fts$$

Figure 5A:
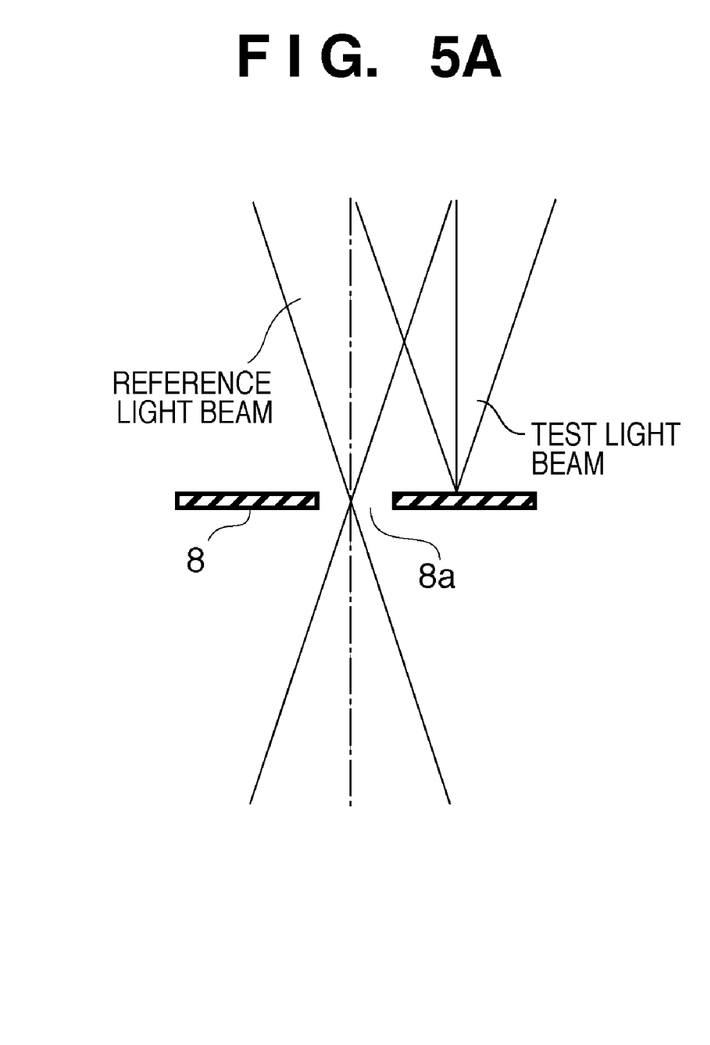
FIGS. 5A and 5B are explanatory diagrams according to the second embodiment of the present invention.
Figure 5B:
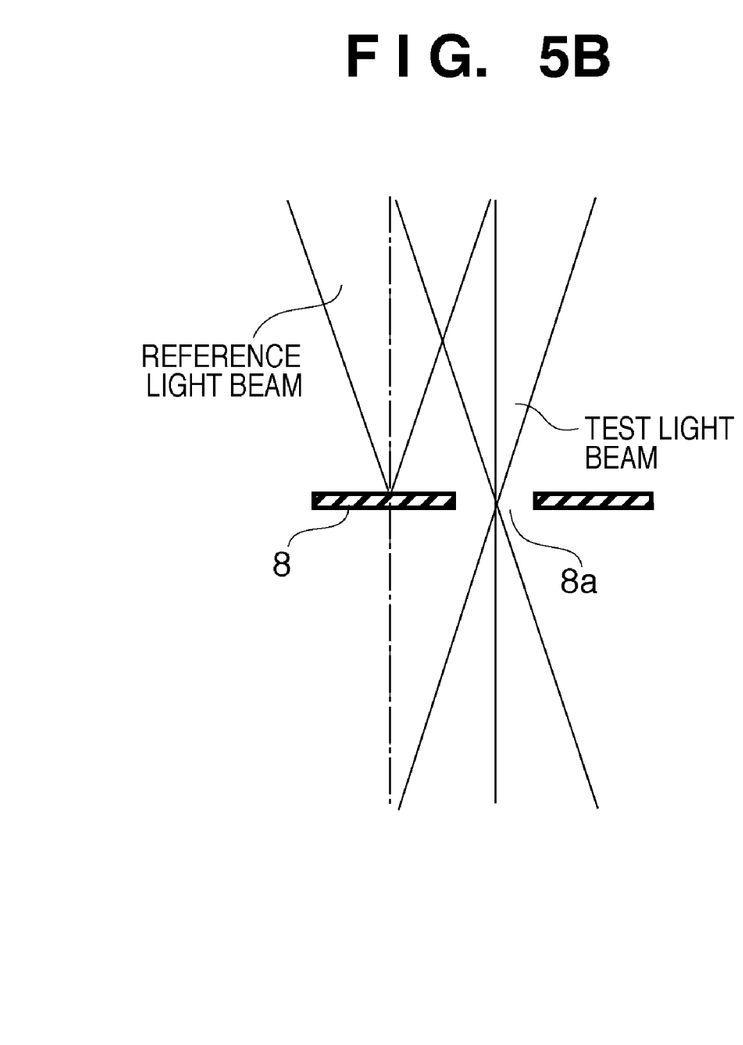

FIGS. 5A and 5B are enlarged diagrams showing the vicinity of the spatial filter 8 which separates the test light beam and the reference light beam by the amount of shift Δspf. Referring to FIGS. 5A and 5B, each alternate long and short dashed line indicates the optical axis of an optical system OP. In measuring the reference light beam, the center of an opening 8a of the spatial filter 8 lies on the optical axis of the optical system OP, as shown in FIG. 5A. On the other hand, in measuring the test light beam, the spatial filter 8 is shifted by Δspf to move the center of the opening 8a of the spatial filter 8 to the position of the test light beam, as shown in FIG. 5B. With this operation, the spatial filter 8 shields the reference light beam, and passes only the test light beam. Separating the test light beam and the reference light beam by the above-described method makes it possible to form a reference light intensity distribution Irsa(x, y) on the image sensing plane of an image sensor 9.

Even when a ball-shaped mirror is set in place of the RS mirror 13, interference fringes can be removed by the same method. Hence, the reflectance distribution of the RS mirror 13 can be obtained by the same method as in the first embodiment.

The same method can be used even in measuring the test light beam reflected by the RS mirror 7. The RS mirror 7 is mounted on an X-Y-Z stage 14. To pass only the test light beam through the spatial filter 8, the RS mirror 7 need only be shifted in a direction perpendicular to the optical axis by Δrsb. Letting βlens be the lateral magnification of the optical system to be measured (e.g., a projection optical system) 6, the amount of shift Δspf of the spatial filter 8 and that Δrsb of the RS mirror 7 satisfy:

$$\Delta spf = 2 \times \Delta rsb/\beta lens \times Fexp/Fts$$

Even when a ball-shaped mirror is set in place of the RS mirror 7, interference fringes can be removed by the same method. Hence, the reflectance distribution of the RS mirror 7 can be obtained by the same method as in the first embodiment.

Since the reflectance distributions of the two RS mirrors can be measured by the above-described method, the transmittance distribution of the optical system to be measured 6 can be measured with high accuracy by the same method as in the first embodiment.

Third Embodiment

This embodiment provides a method of measuring the transmittance distribution of an optical system to be measured by separating a test light beam and a reference light beam by averaging interference fringes.

The measurement apparatus 110 shown in FIG. 4 can be used even in this embodiment. An X-Y-Z stage 14 is driven so that the center of curvature of a spherical mirror serving as an RS mirror 7 matches the imaging point of an optical system to be measured 6. A spatial filter 8 is set such that the center of its opening is aligned with the optical axis of an optical system OP. With this arrangement, interference fringes in which the test light beam and the reference light beam interfere with each other are formed on the image sensing plane of an image sensor 9, in accordance with the light path length difference between the test light beam and the reference light beam, and the transmitted wave front aberration of the optical system to be measured 6. The obtained interference fringes are sensed by the image sensor 9. Information on the test light beam can be acquired by linearly driving a condenser lens 5' by an integer multiple of the half-wave length using a PZT actuator 4 mounted on an X-Y-Z stage 3, and using the integrated light amount detected by the image sensor 9 during this driving.

Figure 6A:
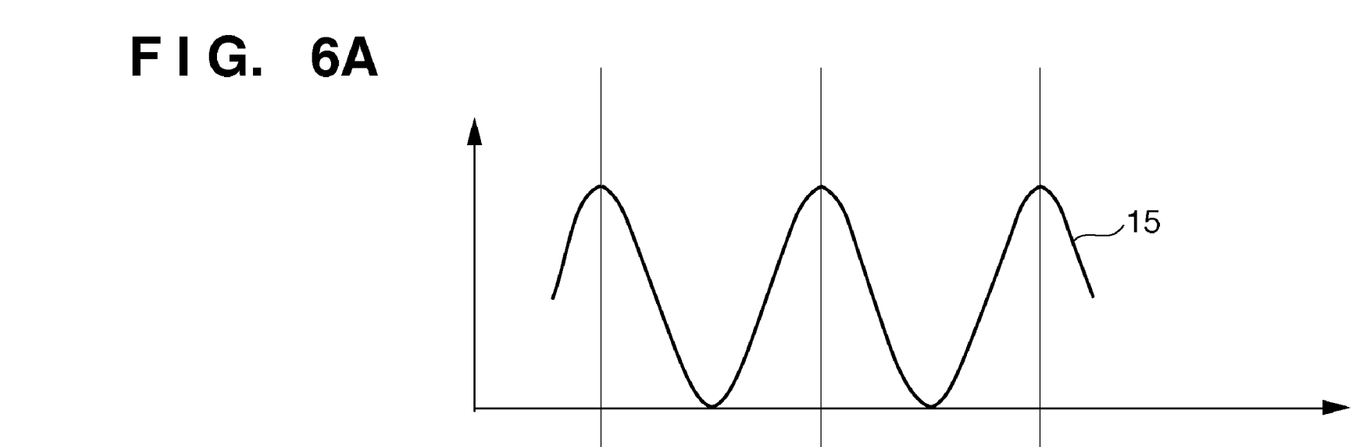
FIGS. 6A and 6B are explanatory graphs according to the third embodiment of the present invention.
Figure 6B:
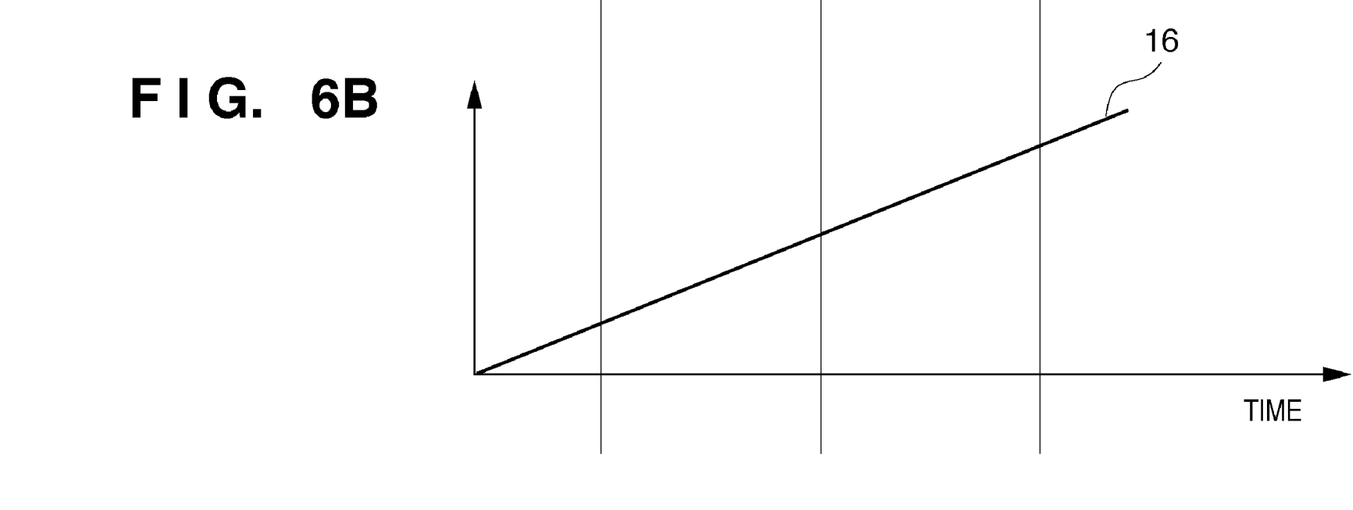

FIGS. 6A and 6B are graphs each showing the amount of driving of the condenser lens 5' by the PZT actuator 4, and the interference fringe intensity in a certain pixel of the image sensor 9. As shown in FIG. 6B, every time an amount of driving 16 of the condenser lens 5' by the PZT actuator 4 becomes a half-integer multiple of the wavelength, an interference fringe intensity 15 shown in FIG. 6A fluctuates periodically. Letting Itest be the amount of test light beam, Iref be the amount of reference light beam, V be the contrast of interference fringes between the test light beam and the reference light beam, and L be the light path length difference between the test light beam and the reference light beam, an interference fringe intensity Ifrg is given by:

$$Ifrg = Itest + Iref + 2V(Itest \times Iref)^{1/2} \cos(2\pi L/\lambda)$$

Accordingly, the integrated light amount obtained by scanning the light path length difference L by an integer multiple of the wavelength is the sum of the amounts of test light beam and reference light beam because the interference component is canceled.

In this embodiment, the interference fringes are averaged by driving the condenser lens 5' by the PZT actuator 4. However, if the wavelength of the light source 1 can be changed, the interference fringes may be averaged by changing the wavelength. Changing the wavelength λ in the above-described equation representing the interference fringe intensity Ifrg makes it possible to change the interference fringes by one period.

Figure 7:
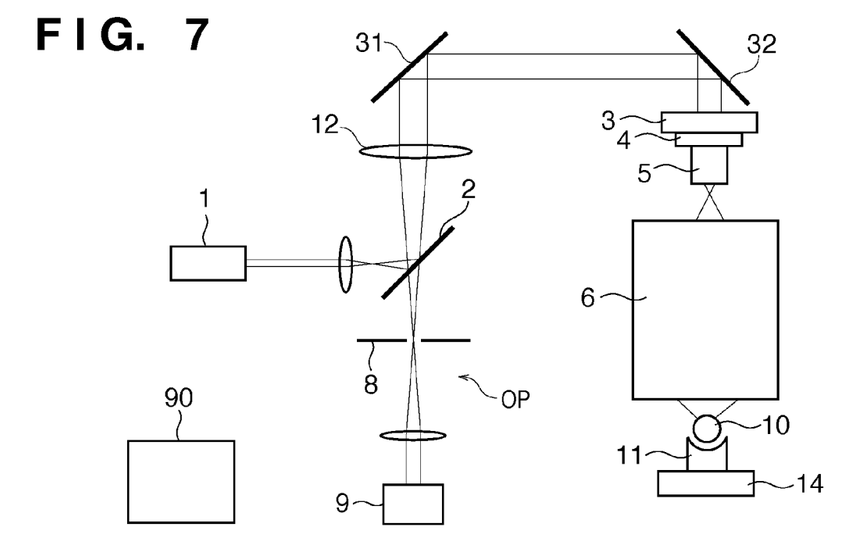
FIG. 7 shows the schematic arrangement of a measurement apparatus according to the third embodiment of the present invention.

Next, a ball-shaped mirror 10 and driving mechanism 11 are mounted on the X-Y-Z stage 14, and the X-Y-Z stage 14 is driven so that the center of the ball-shaped mirror 10 matches the imaging point of the optical system to be measured 6, as shown in FIG. 7. As in the case of the RS mirror 7, when the ball-shaped mirror 10 is driven by the PZT actuator 4 and the integrated light amount is measured, the sum of the amounts of reference light beam and test light beam is obtained. Note that the PZT actuator 4 and driving mechanism 11 must be synchronized to prevent the ball-shaped mirror 10 from rotating during the driving of the ball-shaped mirror 10 by the PZT actuator 4.

Separating the reference light beam and the test light beam by the above-described method makes it possible to obtain the reflectance distributions of the two RS mirrors. Hence, the transmittance distribution of the optical system to be measured 6 can be measured with high accuracy by the same method as in the first embodiment.

Fourth Embodiment

This embodiment provides an exposure apparatus which incorporates the measurement apparatus exemplified in any of the first to third embodiments. Assuming a projection optical system of an exposure apparatus as an optical system to be measured, the measurement apparatus measures the transmittance distribution of the optical system to be measured (the transmittance distribution on its pupil plane). Since the exposure apparatus according to this embodiment incorporates the measurement apparatus, it can confirm the performance of the projection optical system as the optical system to be measured with an arbitrary timing.

Figure 8:
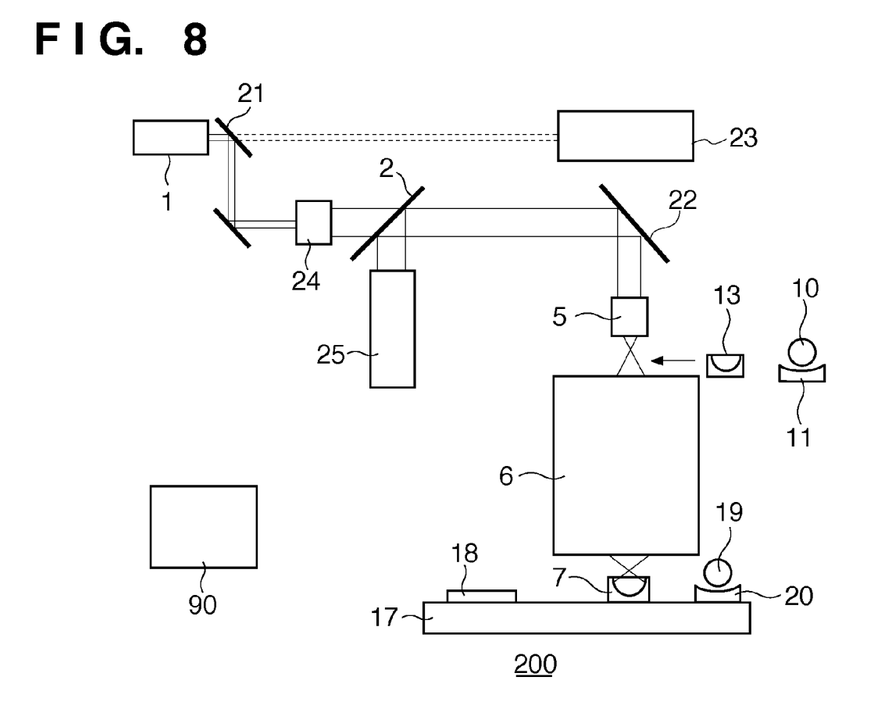
FIG. 8 shows a schematic arrangement of a measurement apparatus according to the fourth embodiment of the present invention.

FIG. 8 shows the arrangement of an exposure apparatus according to the fourth embodiment of the present invention. An exposure apparatus 200 according to this embodiment projects a pattern formed on an original (reticle or mask) onto a substrate (e.g., a wafer or liquid crystal substrate) 18 by a projection optical system (optical system to be measured 6), thereby exposing a photosensitive agent applied on the substrate 18. The exposure apparatus 200 comprises a measurement unit for measuring the reflectance distributions of RS mirrors 13 and 7. The measurement unit includes ball-shaped mirrors 10 and 19, and driving mechanisms 11 and 20 for driving them.

In exposing the substrate 18, a driving unit (not shown) removes bending mirrors 21 and 22 and a condenser lens 5 from a light path for exposing the substrate 18. Light emitted by a light source 1 is supplied to an illumination system 23. The light which emerges from the illumination system 23 enters the projection optical system (optical system to be measured 6) via an original (reticle) (not shown), and strikes the substrate 18 held by a chuck (not shown) mounted on a stage 17. With this operation, the substrate 18 is exposed.

In measuring the transmittance distribution of the projection optical system as the optical system to be measured 6, the driving unit (not shown) inserts the bending mirrors 21 and 22 and condenser lens 5 into the light path for exposure to set the state schematically shown in FIG. 8.

Also, the driving unit (not shown) inserts the RS mirror (first spherical mirror) 13 between the condenser lens 5 and the projection optical system as the optical system to be measured 6. A light beam emitted by the light source 1 is expanded by a beam expander 24, is transmitted through a half mirror 2, and reaches the condenser lens 5. The light beam which emerges from the condenser lens 5 is reflected by the RS mirror 13, is reflected by the half mirror 2, and forms a reference light intensity distribution Irsa(x, y) on the image sensing plane of an image sensor built in an image sensing unit 25. The reference light intensity distribution Irsa(x, y) is sensed by the image sensor. Then, in place of the RS mirror 13, the ball-shaped mirror (first ball-shaped mirror) 10 and driving device (first driving mechanism) 11 are inserted between the condenser lens 5 and the projection optical system as the optical system to be measured 6 by the driving unit (not shown). In this state, a reflected light intensity distribution Iballa(x, y) is sensed by the same method as in the first embodiment, and an average transmitted light intensity distribution Isys(x, y) of the optical system to be measured is obtained on the basis of it. On the basis of the reference light intensity distribution Irsa(x, y) and average transmitted light intensity distribution Isys(x, y), an arithmetic unit 90 calculates a reflectance distribution Rrsa(x, y) of the RS mirror 13 according to the first embodiment.

A method of measuring test light will be explained next. The RS mirror 7, ball-shaped mirror 19, and driving mechanism 20 are mounted on the stage 17 which drives the substrate 18 or another stage, and are driven in this state.

A light beam transmitted through the condenser lens 5 enters the optical system to be measured 6. The light beam transmitted through the optical system to be measured 6 is reflected by the RS mirror (second spherical mirror) 7, is reflected by the half mirror 2, and forms a test light intensity distribution Irsb(x, y) on the image sensing plane of the image sensor built in the image sensing unit 25. The test light intensity distribution Irsb(x, y) is sensed by the image sensor.

Also, in place of the RS mirror 7, the ball-shaped mirror (second ball-shaped mirror) 19 and driving device (second driving mechanism) 20 are set, and a reflected light intensity distribution Iballb(x, y) for the ball-shaped mirror 19 is sensed by the image sensor built in the image sensing unit 25. On the basis of the reflected light intensity distribution Iballb(x, y), the arithmetic unit 90 acquires an average reflected light intensity distribution Ilens(x, y). On the basis of the test light intensity distribution Irsb(x, y) and average reflected light intensity distribution Ilens(x, y), the arithmetic unit 90 calculates a reflectance distribution Rrsb(x, y) of the RS mirror 7 according to the first embodiment.

As in the first embodiment, the arithmetic unit 90 also calculates a transmittance distribution Tlens(x, y) of the projection optical system as the optical system to be measured 6 in accordance with:

$$Tlens(x, y) = C3 \times (Rrsa(x, y)/Rrsb(x, y))^{1/2} \times (Irsb(x, y)/Irsa(x, y))^{1/2}$$

As described above, according to this embodiment, the transmittance distribution of the projection optical system can be measured with high accuracy by taking account of the reflectance distributions of the two RS mirrors 13 and 7 by the same method as in the first embodiment by the measurement apparatus incorporated in the exposure apparatus 200.

Figure 9:
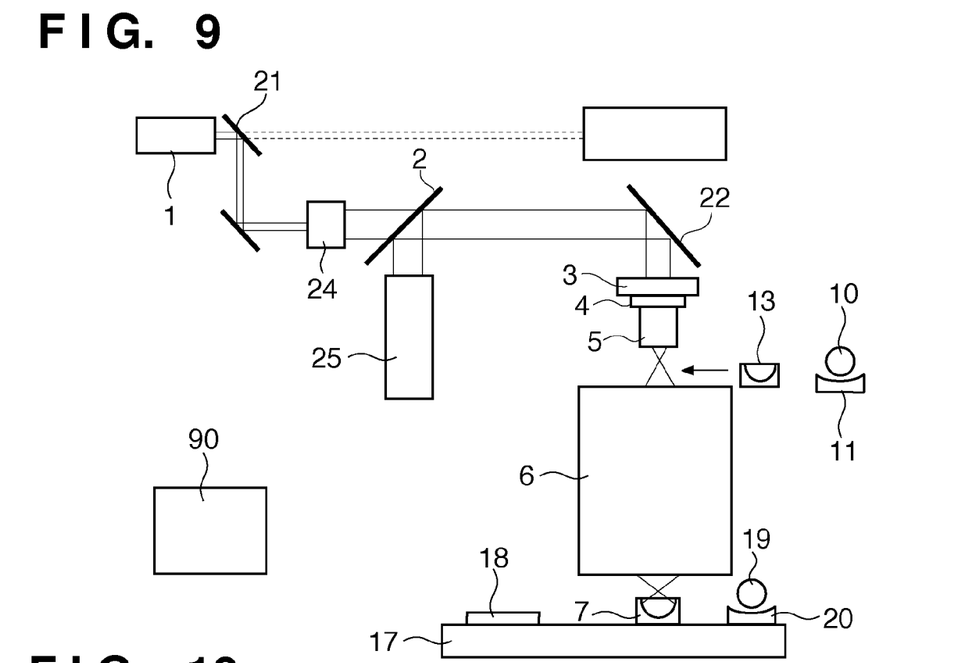
FIG. 9 shows another schematic arrangement of the measurement apparatus according to the fourth embodiment of the present invention.

It is also possible to mount the measurement apparatus according to any of the second and third embodiments in an interferometer mounted in the exposure apparatus. FIG. 9 shows this arrangement. Methods of measuring the transmittance distribution and of removing interference fringes are the same as those in the second and third embodiments, and a description thereof will not be given.

Figure 10:
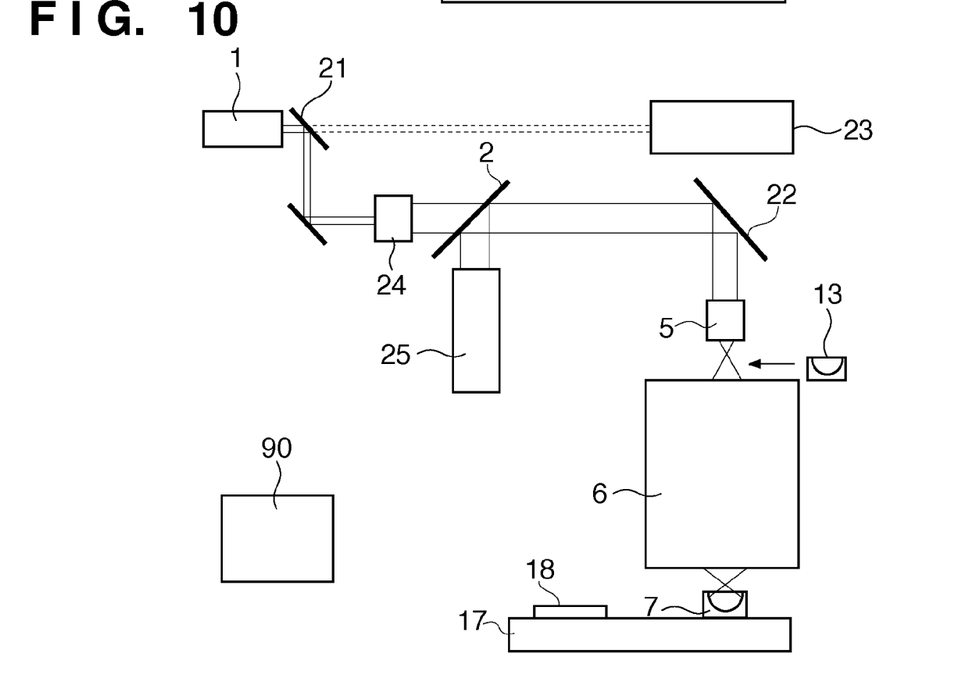
FIG. 10 shows still another schematic arrangement of the measurement apparatus according to the fourth embodiment of the present invention.

As a form in which a measurement apparatus for measuring the transmittance distribution is mounted in an exposure apparatus, FIG. 10 shows an exposure apparatus which uses RS mirrors the reflectance distributions of which are measured by the measurement apparatus according to any one of the first to third embodiments. The reflectance distributions of the RS mirrors 13 and 7 are measured according to any one of the first to third embodiments, and the reflectance distributions Rrsa(x, y) and Rrsb(x, y) of the RS mirrors 13 and 7, respectively, are registered in the exposure apparatus (e.g., a memory in the arithmetic unit 90) in advance. The use of the reflectance distributions Rrsa(x, y) and Rrsb(x, y) allows the arithmetic unit 90 to calculate the transmittance distribution of the projection optical system (optical system to be measured 6) with high accuracy. This arrangement obviates the need to mount the ball-shaped mirrors 10 and 19 and driving mechanisms 11 and 20 as shown in FIG. 8, which is advantageous to space saving.

APPLICATION EXAMPLE

A device (e.g., a semiconductor integrated circuit device or liquid crystal display device) is manufactured by an exposure step of exposing a substrate coated with a photosensitive agent to light using the exposure apparatus according to the above-described embodiment, a development step of developing the photosensitive agent, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-283792, filed Oct. 31, 2007, which is hereby incorporated by reference herein in its entirety.

What is claimed is:

1. A measurement apparatus which measures a transmittance distribution of an optical system to be measured, comprising:
 a light source;
 a first spherical mirror which forms reference light by reflecting light which is emitted by said light source and is not transmitted through the optical system to be measured;
 a second spherical mirror which forms test light by reflecting light which is emitted by said light source and is transmitted through the optical system to be measured;
 a measurement unit which measures intensity distributions of the reference light and the test light, wherein said measurement unit includes a ball-shaped mirror which can rotate about an axis which passes through the center of the ball;
 a unit which calculates reflectance distributions of said first spherical mirror and said second spherical mirror; and
 an arithmetic unit which calculates a transmittance distribution on a pupil plane of the optical system to be measured, on the basis of the intensity distributions of the reference light and the test light, and the reflectance distributions of said first spherical mirror and said second spherical mirror,
 wherein said arithmetic unit calculates the reflectance distribution of said first spherical mirror on the basis of the intensity distribution of the reference light, and an average light intensity distribution formed by light reflected by said ball-shaped mirror, which is obtained by setting said ball-shaped mirror in place of said first spherical mirror and rotating said ball-shaped mirror, and
 wherein said arithmetic unit calculates the reflectance distribution of said second spherical mirror on the basis of the intensity distribution of the test light, and an average light intensity distribution formed by light reflected by said ball-shaped mirror, which is obtained by setting said ball-shaped mirror in place of said second spherical mirror and rotating said ball-shaped mirror.

2. The apparatus according to claim 1, wherein said measurement unit includes a driving mechanism which rotates said ball-shaped mirror.

3. A measurement apparatus which measures a transmittance distribution of an optical system to be measured, comprising:
 a light source;
 a first spherical mirror which forms reference light by reflecting light which is emitted by said light source and is not transmitted through the optical system to be measured;
 a second spherical mirror which forms test light by reflecting light which is emitted by said light source and is transmitted through the optical system to be measured;
 a measurement unit which measures intensity distributions of the reference light and the test light, wherein said measurement unit includes a first ball-shaped mirror and a second ball-shaped mirror which can rotate about axes which pass through the centers of the balls;
 a unit which calculates reflectance distributions of said first spherical mirror and said second spherical mirror; and
 an arithmetic unit which calculates a transmittance distribution on a pupil plane of the optical system to be measured, on the basis of the intensity distributions of the reference light and the test light, and the reflectance distributions of said first spherical mirror and said second spherical mirror,
 wherein said arithmetic unit calculates the reflectance distribution of said first spherical mirror on the basis of the intensity distribution of the reference light, and an average light intensity distribution formed by light reflected by said first ball-shaped mirror, which is obtained by setting said first ball-shaped mirror in place of said first spherical mirror and rotating said first ball-shaped mirror, and
 wherein said arithmetic unit calculates the reflectance distribution of said second spherical mirror on the basis of the intensity distribution of the test light, and an average light intensity distribution formed by light reflected by said second ball-shaped mirror, which is obtained by setting said second ball-shaped mirror in place of said second spherical mirror and rotating said second ball-shaped mirror.

4. The apparatus according to claim 3, wherein said measurement unit includes a first driving mechanism which rotates said first ball-shaped mirror, and a second driving mechanism which rotates said second ball-shaped mirror.

* * * * *